United States Patent
Stokkermans (10) Patent No.: US 10,199,254 B2
(45) Date of Patent: Feb. 5, 2019

(54) METHOD AND SYSTEM FOR TRANSFERRING SEMICONDUCTOR DEVICES FROM A WAFER TO A CARRIER STRUCTURE

(71) Applicant: Nexperia B.V., Nijmegen (NL)

(72) Inventor: Jozef Petrus Wilhelmus Stokkermans, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 631 days.

(21) Appl. No.: 14/710,302

(22) Filed: May 12, 2015

(65) Prior Publication Data

US 2016/0336207 A1    Nov. 17, 2016

(51) Int. Cl.
| | |
|---|---|
| B23P 19/00 | (2006.01) |
| H01L 21/683 | (2006.01) |
| H01L 21/67 | (2006.01) |
| H01L 21/56 | (2006.01) |

(52) U.S. Cl.
CPC .... *H01L 21/6835* (2013.01); *H01L 21/67144* (2013.01); *H01L 21/561* (2013.01); *Y10T 29/53174* (2015.01)

(58) Field of Classification Search
CPC ........... H01L 21/6835; H01L 21/67144; H01L 21/561; B65B 5/105; B23P 19/001; Y10T 29/4913; Y10T 29/49131; Y10T 29/53174; Y10T 29/53187
USPC .......... 29/712, 739, 741, 832; 198/357, 382
See application file for complete search history.

(56) References Cited

U.S. PATENT DOCUMENTS

| | | | | |
|---|---|---|---|---|
| 4,874,076 | A * | 10/1989 | Kaplan | B65B 5/105 198/357 |
| 5,501,005 | A * | 3/1996 | Onitsuka | B23P 19/001 29/741 |
| 6,651,800 | B2 * | 11/2003 | Baclija | B65B 35/58 198/382 |
| 7,726,011 | B2 * | 6/2010 | Bosch | H01L 21/67144 29/739 |
| 2007/0137031 | A1 | 6/2007 | Bosch et al. | |
| 2008/0061275 | A1 | 3/2008 | Stokkermans | |
| 2010/0223767 | A1 | 9/2010 | Vianen et al. | |

FOREIGN PATENT DOCUMENTS

WO    2013171863 A1    11/2013

* cited by examiner

*Primary Examiner* — Donghai D Nguyen
(74) *Attorney, Agent, or Firm* — Ohlandt, Greeley, Ruggiero & Perle, L.L.P.

(57) ABSTRACT

Embodiments of methods and system for transferring semiconductor devices from a wafer to a carrier structure are described. In one embodiment, a method for transferring semiconductor devices from a wafer to a carrier structure involves positioning a carrier structure with a bond surface extending in a first plane and transferring a semiconductor device from a wafer onto the bond surface of the carrier structure using a plurality of rotatable transfer assemblies. Centers of the rotatable transfer assemblies are positioned in parallel with the first plane.

6 Claims, 12 Drawing Sheets

METHOD AND SYSTEM FOR TRANSFERRING SEMICONDUCTOR DEVICES FROM A WAFER TO A CARRIER STRUCTURE

BACKGROUND

In a semiconductor manufacturing process, semiconductor devices are transferred from a semiconductor wafer onto a carrier structure, such as a tape or a lead frame, for packaging purposes. In a typical chip transfer system, a chip transfer unit and a chip flip unit are used to pick up a semiconductor chip from a semiconductor wafer, to flip the orientation of the semiconductor chip, and to place the semiconductor chip onto a carrier structure. For example, the chip transfer unit can be used to pick up an integrated circuit (IC) die from a wafer and transfer the IC die onto the chip flip unit, which is typically placed between the chip transfer unit and a carrier substrate. The chip flip unit can be used to flip the orientation of the IC die and to place the flipped IC die on the carrier substrate. For example, a wafer is usually positioned with the active side (also referred to as the bumped side, top side, or front side) facing the chip transfer and chip flip units. The chip transfer unit picks up the IC die on the bumped side while the chip flip unit flips the IC die such that the bumped side is up and places the flipped IC die on a carrier substrate with the bumped side facing upward.

SUMMARY

Embodiments of methods and system for transferring semiconductor devices from a wafer to a carrier structure are described. In one embodiment, a method for transferring semiconductor devices from a wafer to a carrier structure involves positioning a carrier structure with a bond surface extending in a first plane and transferring a semiconductor device from a wafer onto the bond surface of the carrier structure using a plurality of rotatable transfer assemblies. Centers of the rotatable transfer assemblies are positioned in parallel with the first plane.

In an embodiment, the rotatable transfer assemblies include a first rotatable transfer assembly and a second rotatable transfer assembly. Each of the first and second rotatable transfer assemblies includes at least two transfer heads. Transferring the semiconductor device from the wafer onto the bond surface of the carrier structure involves rotating a transfer head of the first rotatable transfer assembly to a pick-up position to pick up the semiconductor device from the wafer and rotating the transfer head of the first rotatable transfer assembly to a flip position.

In an embodiment, rotating the transfer head of the first rotatable transfer assembly to the flip position involves rotating the transfer head of the first rotatable transfer assembly 180 degrees from the pick-up position.

In an embodiment, the method further involves checking an alignment of the semiconductor device before the semiconductor device is picked up from the wafer in the pick-up position using the transfer head of the first rotatable transfer assembly.

In an embodiment, the method further involves checking an alignment of the semiconductor device before the transfer head of the first rotatable transfer assembly is rotated to the flip position.

In an embodiment, the method further involves checking the alignment of the semiconductor device before the transfer head of the first rotatable transfer assembly is rotated to the flip position comprises checking the alignment of the semiconductor device after the semiconductor device is rotated 90 degrees from the pick-up position.

In an embodiment, transferring the semiconductor device from the wafer onto the bond surface of the carrier structure further involves rotating a transfer head of the second rotatable transfer assembly to the flip position, transferring the semiconductor device from the transfer head of the first rotatable transfer assembly to the transfer head of the second rotatable transfer assembly, and rotating the transfer head of the second rotatable transfer assembly to place the semiconductor device onto the bond surface.

In an embodiment, rotating the transfer head of the second rotatable transfer assembly to place the semiconductor device onto the bond surface involves rotating the transfer head of the second rotatable transfer assembly 270 degrees from the flip position.

In an embodiment, the method further involves checking an alignment of the carrier structure before the semiconductor device is bonded at a bonding position on the bond surface of the carrier structure.

In an embodiment, the method further involves checking an alignment of the carrier structure after the semiconductor device is bonded at the bonding position on the bond surface of the carrier structure.

In an embodiment, the method further involves sealing the semiconductor device into the carrier structure and checking an alignment of the bond surface after the semiconductor device is sealed into the carrier layer.

In an embodiment, the method further involves positioning the wafer with surfaces of semiconductor devices extending in a second plane, where the second plane is perpendicular to the first plane.

In one embodiment, a system for transferring semiconductor devices from a wafer to a carrier structure includes a carrier movement mechanism configured to position a carrier structure with a bond surface extending in a first plane and rotatable transfer assemblies configured to transfer a semiconductor device from a wafer onto the bond surface of the carrier structure using. Centers of the rotatable transfer assemblies are positioned in parallel with the first plane.

In an embodiment, the rotatable transfer assemblies include a first rotatable transfer assembly and a second rotatable transfer assembly. Each of the first and second rotatable transfer assemblies includes at least two transfer heads. The first rotatable transfer assembly is configured to rotate a transfer head to a pick-up position to pick up the semiconductor device from the wafer and rotate the transfer head to a flip position.

In an embodiment, the first rotatable transfer assembly is configured to rotate the transfer head 180 degrees from the pick-up position.

In an embodiment, the system includes an alignment device configured to check an alignment of the semiconductor device before the semiconductor device is picked up from the wafer in the pick-up position using the transfer head of the first rotatable transfer assembly.

In an embodiment, the second rotatable transfer assembly is configured to rotate a transfer head to the flip position, transfer the semiconductor device from the transfer head of the first rotatable transfer assembly to the transfer head of the second rotatable transfer assembly, and rotate the transfer head of the second rotatable transfer assembly to place the semiconductor device onto the bond surface.

In one embodiment, a method for transferring IC dies from a wafer to a carrier structure involves positioning a carrier structure with a bond surface extending in a first plane, positioning a wafer with surfaces of IC dies extending in a second plane, where the second plane is perpendicular to the first plane, checking an alignment of an IC die on the wafer, transferring the IC die from a wafer onto the bond surface of the carrier structure using rotatable transfer assemblies, and checking an alignment of the IC die before and after the flipped IC die is transferred onto the bond surface. The rotatable transfer assemblies include a first rotatable transfer assembly and a second rotatable transfer assembly. Centers of the first and second rotatable transfer assemblies are positioned in parallel with the first plane. Transferring the IC die from the wafer onto the bond surface of the carrier structure involves flipping the IC die using the first rotatable transfer assembly and transferring the flipped IC die onto the bond surface using the second rotatable transfer assembly.

In an embodiment, flipping the IC die using the first rotatable transfer assembly involves rotating a transfer head of the first rotatable transfer assembly 180 degrees from an IC die pick-up position.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Generally, optical inspections take place at various positions to assure proper die positions during chip transferring and flipping. However, because the chip flip unit is typically placed between the chip transfer unit and the carrier substrate, the optical inspection process is on the device transfer path of a machine cycle, which is the path in which a semiconductor chip is moved or transported from a wafer to a carrier substrate through the chip transfer unit and the chip flip unit. Consequently, the optical inspection process can slow down the machine output, for example, by 50%.

Figure 1:
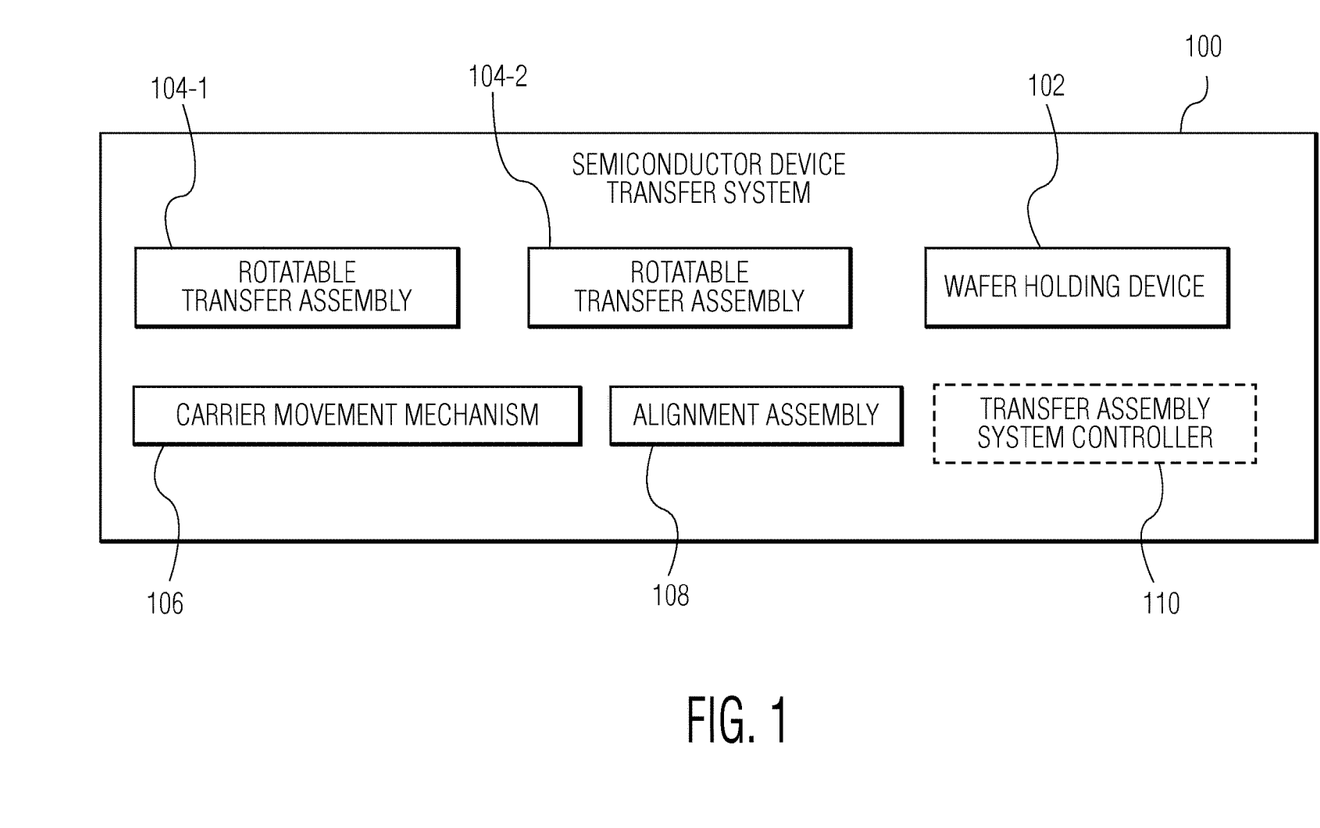
FIG. 1 is a schematic block diagram of a semiconductor device transfer system in accordance with an embodiment of the invention.

FIG. 1 is a schematic block diagram of a semiconductor device transfer system 100 in accordance with an embodiment of the invention. In the embodiment depicted in FIG. 1, the semiconductor device transfer system includes a wafer holding device 102, two rotatable transfer assemblies 104-1, 104-2, a carrier movement mechanism 106, an alignment assembly 108, and a transfer assembly system controller 110, which may include a transfer assembly driver device. The semiconductor device transfer system can be used for semiconductor device packaging. For example, the semiconductor device transfer system can be used to transfer semiconductor devices from a wafer to a carrier structure such as a lead frame or a carrier tape that is positioned at the carrier movement mechanism. Examples of semiconductor devices that can be transferred by the semiconductor device transfer system include, without being limited to, intergraded circuit (IC) chips, IC dies and other IC modules. The size of an IC die can be in any suitable range. For example, the size of an IC die can be in the range between 0.22 millimeter (mm)×0.22 mm for diodes and up to 5 mm×5 mm for bare dies like Wafer Level Chip Scale Packaging (WLCSP) dies. Although the semiconductor device transfer system is shown in FIG. 1 as including certain components, in some embodiments, the semiconductor device transfer system includes less or more components to implement less or more functionalities. For example, the semiconductor device transfer system may include more than two rotatable transfer assemblies.

The wafer holding device 102 of the semiconductor device transfer system 100 is configured to hold a wafer, which includes a number of semiconductor devices (e.g., IC dies or chips fabricated thereon and semiconductor packages), in place for semiconductor device pick-up by the rotatable transfer assemblies 104-1, 104-2. In some embodiments, the wafer holding device is located on a moving platform (e.g., a spinning wheel or a convoy belt) or includes a moving platform such that the wafer holding device can continuously change the position from which a semiconductor device is picked up by the rotatable transfer assemblies. In an embodiment, a wafer is spanned on an X-Y wafer table to index and align individual IC dies to the rotatable transfer assemblies at a pick-up position.

The carrier movement mechanism 106 of the semiconductor device transfer system 100 is used to position or move a carrier structure (e.g., a lead frame or a carrier tape). The carrier movement mechanism may have a channel through which a carrier structure is fed. In some embodiments, the carrier structure has a bond surface on which the semiconductor devices are placed. Examples of the carrier structure include, without being limited, lead frames and carrier tapes. In some embodiments, the carrier movement mechanism is a moving platform (e.g., a conveyor system) such that the carrier structure can continuously change the position at which a semiconductor device is placed. Examples of the carrier movement mechanism are endless reel to reel leadframe indexers, strip to strip indexers and reel-to-reel carrier tape indexers.

The rotatable transfer assemblies 104-1, 104-2 of the semiconductor device transfer system 100 are used to transfer a semiconductor device from the wafer held by the wafer holding device 102 onto a bond surface of the carrier structure that is located at the carrier movement mechanism 106. Each of the rotatable transfer assemblies may have at least two transfer heads and each of the transfer heads is used to transfer one semiconductor device at one time. The rotatable transfer assemblies can pick up and hold semiconductor devices by suction, by force or by other applicable means. In some embodiments, at least one transfer head of the rotatable transfer assemblies includes a hold device having at least one pick-up opening for picking up, holding, and releasing a semiconductor device by varying the pressure at the pick-up opening. When the transfer head is in a semiconductor device pick-up position, the pick-up opening is brought into close proximity to the semiconductor device, and a low pressure (e.g., vacuum) is generated in the opening, whereby the semiconductor device is sucked to and against the opening. While maintaining the low pressure, the semiconductor device is transferred by the transfer head to another chip transfer position, and the semiconductor device can be released by applying a higher pressure to the pick-up opening.

The alignment assembly 108 of the semiconductor device transfer system 100 is configured to check an alignment of a semiconductor device during the transfer process from a wafer at the wafer holding device 102 to the carrier structure that is located at the carrier movement mechanism 106. In some embodiments, the alignment assembly optically checks an alignment of a semiconductor device. In an embodiment, the alignment assembly includes a machine vision system (e.g., an optics system such as a CMOS camera) controlled by the transfer assembly system controller 110. The alignment assembly can check an alignment of a semiconductor device before picking up the semiconductor device from a wafer at the wafer holding device, check an alignment of a semiconductor device while the semiconductor device is being transferred, check an alignment of a semiconductor device right before the semiconductor device is placed onto the carrier structure, and/or check an alignment of a semiconductor device after the semiconductor device is placed onto the carrier structure. Although the semiconductor device transfer system is shown in FIG. 1 as including one alignment assembly, in some embodiments, the semiconductor device transfer system includes more than one alignment assembly that is located in different locations within the semiconductor device transfer system and is used to check the transfer of semiconductor devices in different positions.

The transfer assembly system controller 110 of the semiconductor device transfer system 100 is used to control the rotatable transfer assemblies 104-1, 104-2, e.g., to drive the rotatable transfer assemblies 104-1, 104-2 to transfer a semiconductor device from the wafer at the wafer holding device 102 onto a bond surface of the carrier structure that is located at the carrier movement mechanism 106. In some embodiments, each rotatable transfer assembly is driven by a transfer assembly system controller, such as a position servo system or an electric-mechanical servo system. In an embodiment, each transfer assembly includes a servo motor feedback control system, which is a rotary actuator that allows for precise control of angular position and is controlled by the transfer assembly system controller.

In some embodiments, centers of the rotatable transfer assemblies 104-1, 104-2 are positioned in parallel with a plane in which a bond surface of the carrier structure that is located at the carrier movement mechanism 106 extends. Because the centers of the rotatable transfer assemblies are positioned in parallel with the bond surface of the carrier structure, the inspection positions of the alignment assemblies for flip chip transfer inspections are separated from inspection positions of the carrier substrate and the alignment assembly 108 can be placed outside of the device transfer path of a machine cycle, which is the path in which a semiconductor chip rotates from a wafer at the wafer holding device 102 to the carrier structure through the rotatable transfer assemblies. Consequently, semiconductor die inspections can be done in parallel with semiconductor die placement and pick-up instead of in series with semiconductor die placement or transfer, and the semiconductor device alignment process does not slow down the machine cycle as can be the case with a typical semiconductor device transfer system in which a chip flip unit is placed between a chip transfer unit and a carrier substrate. Therefore, compared to a typical semiconductor device transfer system in which a chip flip unit is placed between a chip transfer unit and a carrier substrate, the semiconductor device transfer system 100 allows the machine cycle to operate at higher frequency and have a higher semiconductor device throughput.

Figure 2:
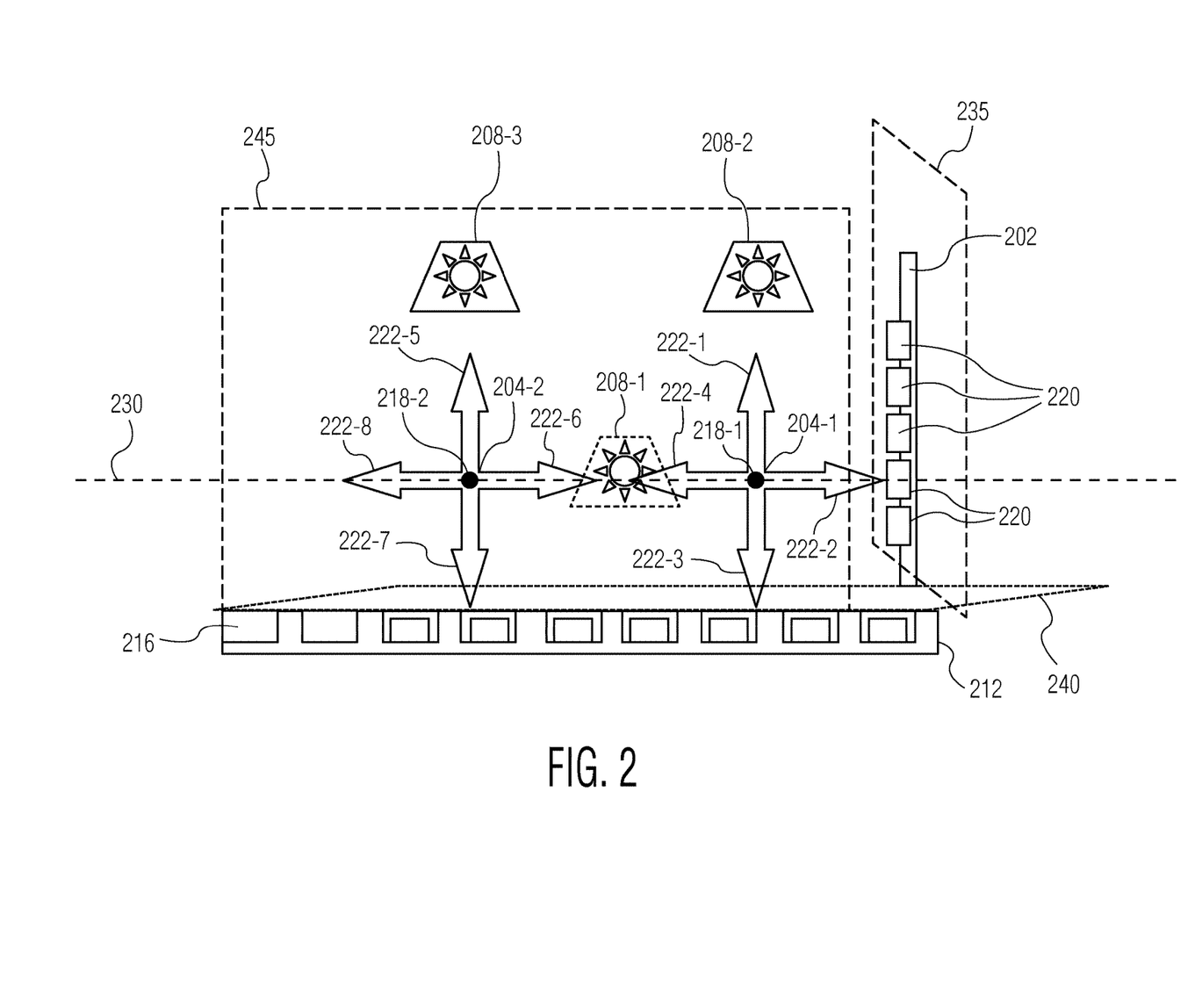
FIG. 2 depicts an embodiment of the semiconductor device transfer system depicted in FIG. 1.

FIG. 2 depicts an embodiment of a semiconductor device transfer system 200 in which centers of the rotatable transfer assemblies 104-1, 104-2 are positioned in parallel with a plane in which a bond surface of a carrier structure 212 that is positioned by the carrier movement mechanism 106 extends. In the semiconductor device transfer system depicted in FIG. 2, two rotatable transfer assemblies 204-1, 204-2 are used to transfer semiconductor devices 220 (e.g., IC chips or dies) from a wafer held by a wafer holding device 202 onto a bond surface 216 of the carrier structure that is positioned by the carrier movement mechanism and alignment assemblies 208-1, 208-2, 208-3 are used to check the transfer of semiconductor devices in different positions. The rotating centers 218-1, 218-2 of the rotatable transfer assemblies are located at a dotted line 230 depicted in FIG. 2. The wafer held by the wafer holding device 202 is located/moved in a first plane 235, the bond surface of the carrier structure extends in a second plane 240, which is in parallel with the dotted line 230 and is perpendicular to the first plane 235, and a third plane (i.e., a device transfer plane) 245 in which a semiconductor device is picked up from the wafer and transferred to the carrier structure by the rotatable transfer assemblies 104-1, 104-2 is perpendicular to the first plane 235 and the second plane 240. The rotatable transfer assemblies 204-1, 204-2 and the alignment assemblies 208-1, 208-2, 208-3 depicted in FIG. 2 are embodiments of the rotatable transfer assemblies 104-1, 104-2 and the alignment assembly 108 depicted in FIG. 1. The semiconductor device transfer system depicted in FIG. 2 is one possible embodiment of the semiconductor device transfer system depicted in FIG. 1. However, the semiconductor device transfer system depicted in FIG. 1 is not limited to the embodiment shown in FIG. 2.

Each rotatable transfer assembly 204-1 has multiple transfer heads, which can be any suitable number of transfer heads (e.g., 4 transfer heads or 8 transfer heads). In some embodiments, the rotatable transfer assembly 204-1 has four transfer heads 222-1, 222-2, 222-3, 222-4 and the rotatable transfer assembly 204-2 also has four transfer heads 222-5, 222-6, 222-7, 222-8. In general, a four head set-up moves in 4×90 degree incremental moves to complete a semiconductor die transfer cycle. After each move of 90 degrees, a process takes place, e.g. die pick-up at 3 o'clock, die inspection at 12 o'clock, die hand over to at 9 o'clock, etc. Each transfer head is used to transfer one semiconductor device at a time. For example, within a transfer cycle, the transfer head 222-1 of the rotatable transfer assembly 204-1 can be used to pick up a first semiconductor device, the transfer head 222-2 can be used to transfer a second semiconductor device, the transfer head 222-3 can be used to transfer a third semiconductor device, and the transfer head 222-4 can be used to transfer a fourth semiconductor device. By positioning the second rotatable transfer assembly 204-2 next to the rotatable transfer assembly 204-1 and in parallel with the bond surface 216 of the carrier structure 212, the rotation of semiconductor devices in the transfer process is in parallel with the carrier structure. Consequently, the flip function of semiconductor devices can be enabled at a similar speed and using similar processes as a non-flip semiconductor transfer system.

Alignment assemblies 208-1, 208-2, 208-3 are located in different locations within the semiconductor device transfer system 200 and are used to check the transfer of semiconductor devices in different positions. Specifically, the alignment assembly 208-1 is located between the rotatable transfer assembly 204-1 and the rotatable transfer assembly 204-2 and is used to check an alignment of a semiconductor device before the semiconductor device is picked up from the wafer holding device 202 using a transfer head of the rotatable transfer assembly 204-1. The alignment assembly 208-2 is located above the rotatable transfer assembly 204-1 and can be used to check an alignment of a semiconductor device before the semiconductor device is transferred from the rotatable transfer assembly 204-1 to the rotatable transfer assembly 204-2 and after the semiconductor device is bonded to the carrier structure 212. In some embodiments, the alignment assembly 208-2 checks the alignment of a semiconductor device after the semiconductor device is rotated 90 degrees from the original pick-up position at the wafer holding device. The alignment assembly 208-3 is located above the rotatable transfer assembly 204-2 and can be used to check an alignment of a semiconductor device before the semiconductor device is bonded at a chip bonding position on the bond surface 216 of the carrier structure 212 and after the semiconductor device is bonded to the carrier structure. The alignment assemblies 208-1, 208-2, 208-3 can optically check the alignment of a semiconductor device, for example, by shining a light at the semiconductor device and checking the reflection of the light by the semiconductor device.

Figure 3:
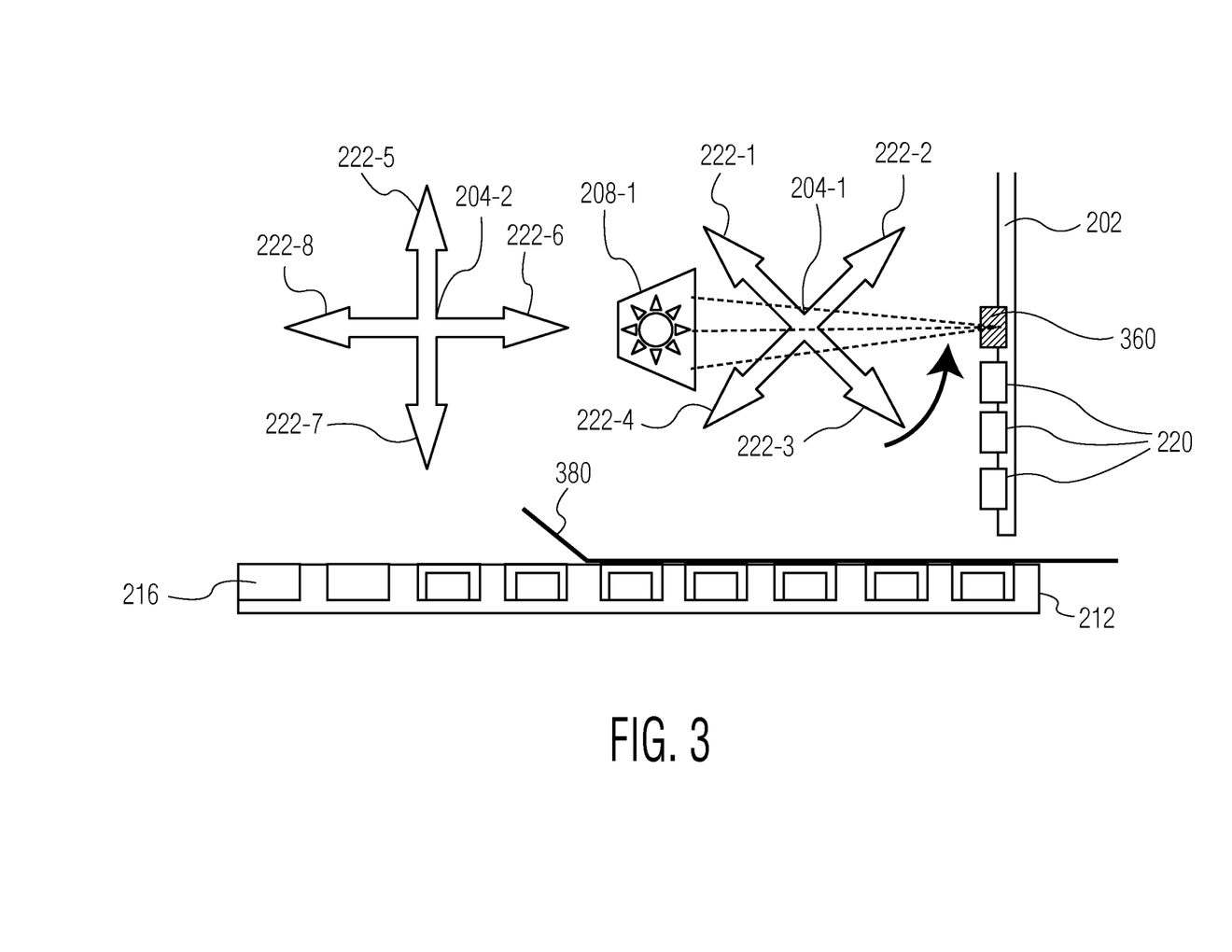
FIGS. 3-6 illustrate an example of a machine cycle of the semiconductor device transfer system depicted in FIG. 2.

FIGS. 3-6 illustrate an example of a machine cycle of the semiconductor device transfer system 200 depicted in FIG. 2. The machine cycle includes two phases, which are the move phase in which semiconductor devices 220 are being moved/transferred and the process phase in which the movement/transfer of semiconductor devices is stopped. Inspections of semiconductor devices performed at the process phase (e.g., the inspection of a semiconductor die on the transfer head 222-1 shown in FIG. 2) are typically outside the device transfer path. However, inspections of semiconductor devices performed at the move phase are typically inside the device transfer path, and consequently, need to be done in a timely manner. The semiconductor device transfer system 200 can reduce inspection time during the move phase (e.g., requires only a single image intake during the move phase), which improves the system throughput. FIG. 3 depicts an alignment check step in which the alignment of a semiconductor device 220 relative to the wafer holding device 202 is checked before the semiconductor device is picked up. As shown in FIG. 3, the alignment assembly 208-1 checks the alignment of the semiconductor device relative to the wafer holding device 202 at a chip pick-up position 360 before the semiconductor device is picked up by the transfer head 222-3 of the rotatable transfer assembly 204-1. In some embodiments, the alignment assembly 208-1 optically checks the alignment of a semiconductor device with respect to the surface of the wafer holding device. For example, the alignment assembly checks the alignment of the semiconductor device by shining a light at the semiconductor device and checking the reflection of the light by the semiconductor device so as to determine whether the semiconductor device is perpendicular to the wafer holding device. If the alignment check step determines that the semiconductor device is not properly aligned at the wafer holding device 202, the alignment assembly can cause a movement of the wafer holding device or to notify a technician to adjust the wafer holding device. In an embodiment, a cover layer 380 (e.g., a tape layer) covers (e.g., rolls onto) the carrier structure 212.

Figure 4:
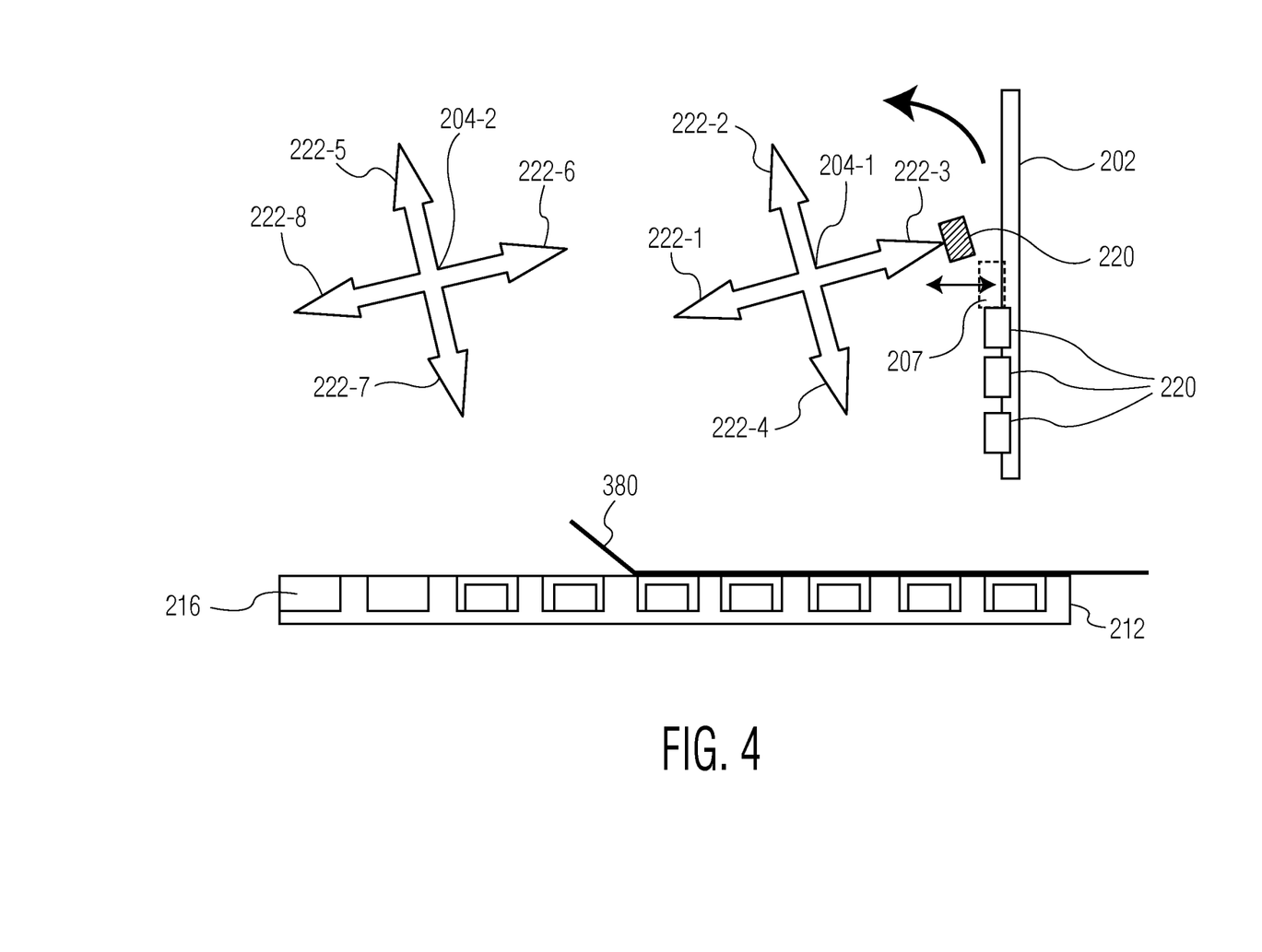

After the alignment check step shown in FIG. 3 determines that the semiconductor device 220 is properly aligned at the wafer holding device 202, the semiconductor device is picked up from the wafer. In FIG. 3, a target semiconductor device is aligned at a pick-up position by optical alignment and subsequent die location adjustment on the wafer (e.g., die index correction on the wafer). FIG. 4 depicts the semiconductor device transfer system 200 shortly after the semiconductor device is picked up from the wafer by the transfer head 222-3 of the rotatable transfer assembly 204-1 and transferred by the transfer head 222-3 towards an inspection position at 12 o'clock. As shown in FIG. 4, the transfer head 222-3 of the rotatable transfer assembly 204-1 is rotated to the chip pick-up position 360 to pick up the semiconductor device. In this transfer move, the transfer head 222-2 is indexed to a die transfer position at 9 o'clock.

Figure 5:
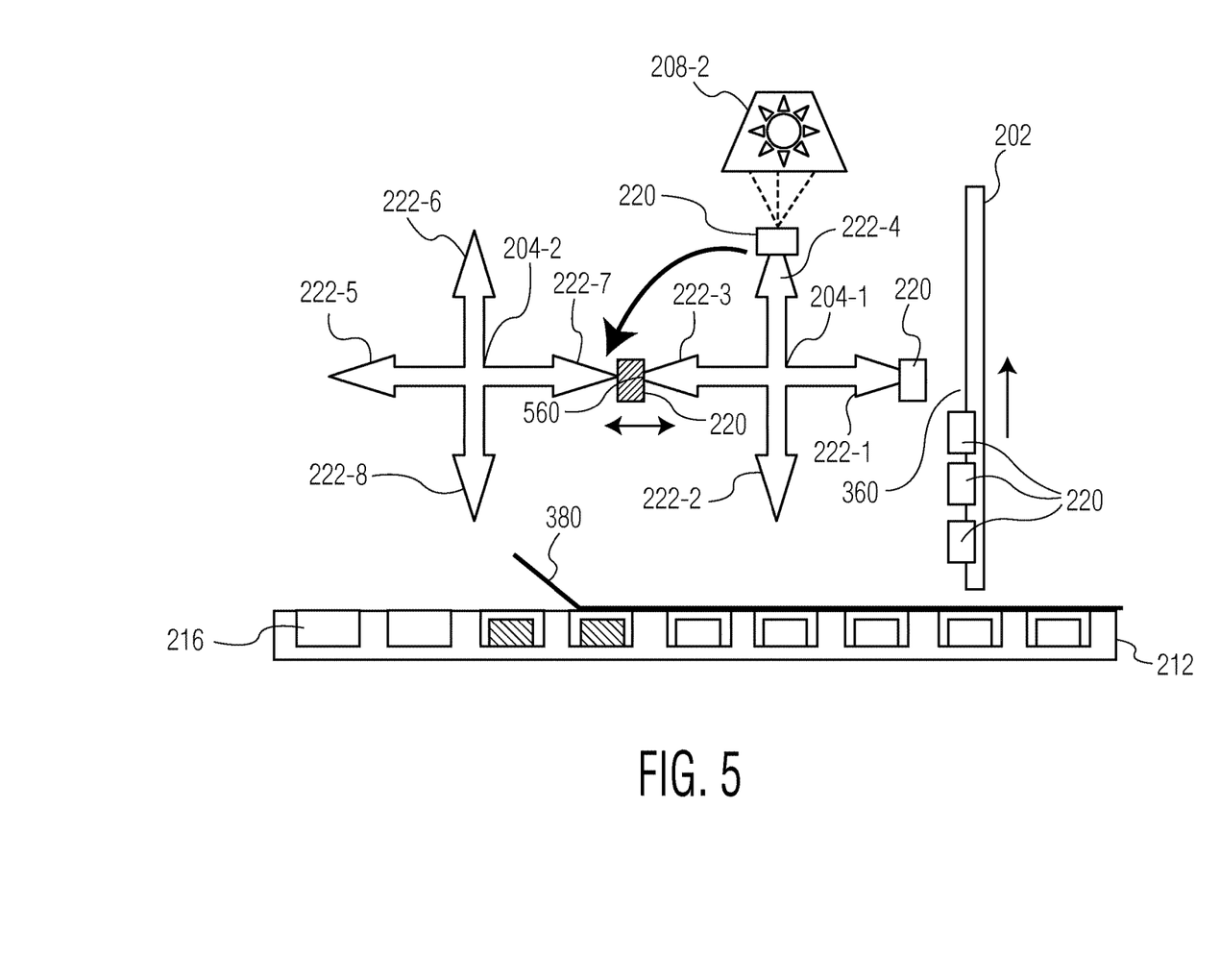

After the semiconductor device 220 is picked up from the wafer holding device 202, the rotatable transfer assembly 204-1 is rotated to transfer the semiconductor device to the rotatable transfer assembly 204-2. FIG. 5 depicts a semiconductor device transfer step in which the semiconductor device is transferred from the rotatable transfer assembly 204-1 to the rotatable transfer assembly 204-2. As shown in FIG. 5, the transfer head 222-3 of the rotatable transfer assembly 204-1 is rotated to a chip flip position 560, from which the semiconductor device is picked up by the transfer head 222-7 of the rotatable transfer assembly 204-2. In some embodiments, the transfer head 222-3 of the rotatable transfer assembly 204-1 is rotated 180 degrees from the chip pick-up position 360 to the chip flip position. An alignment check can be performed by the alignment assembly 208-2 during the process of transferring the semiconductor device from the rotatable transfer assembly 204-1 to the rotatable transfer assembly 204-2. For example, the alignment assembly 208-2 optically checks the alignment of the semiconductor device after the transfer head 222-3 of the rotatable transfer assembly 204-1 is rotated 90 degrees from the chip pick-up position.

Figure 6:
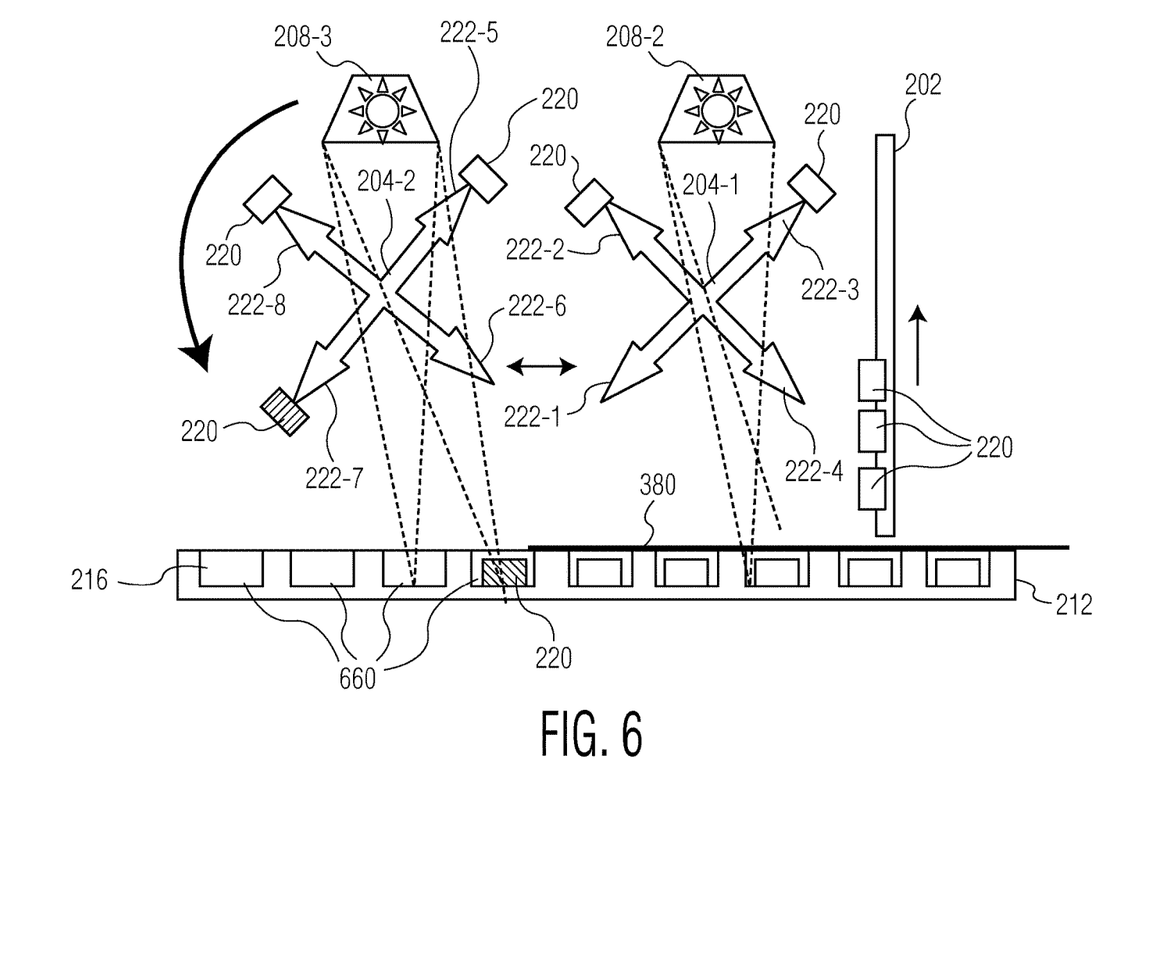

After the semiconductor device 220 is transferred to the rotatable transfer assembly 204-2, the rotatable transfer assembly 204-2 is rotated to place the semiconductor device onto the carrier structure 212. The semiconductor device (e.g., a semiconductor die) can be placed on a horizontal bond pad in a die bonding process. Alternatively, the semiconductor device (e.g., a semiconductor chip or a quad-flat no-leads (QFN) package) can be placed into a cavity of the blister tape or carrier tape in a die sorting or taping process. FIG. 6 depicts the semiconductor device transfer system 200 right before the semiconductor device 220 is transferred from the rotatable transfer assembly 204-2 onto the bond surface 216 of the carrier structure. As shown in FIG. 6, the transfer head 222-7 of the rotatable transfer assembly 204-2 is rotated to place the semiconductor device into an opening 660 (e.g., a gap or a hole) on the bond surface of the carrier structure. In some embodiments, the cover layer 380 (e.g., a tape layer) covers (e.g., rolls onto) the opening to seal the semiconductor device into the carrier layer. Alignment checks can be performed by the alignment assemblies 208-2, 208-3 during and after the process of placing the semiconductor device onto the carrier structure. For example, the alignment assembly 208-3 can optically check the alignment of the semiconductor device right before and right after the semiconductor device is placed into an opening on the carrier structure while the alignment assembly 208-2 can optically check the alignment of the semiconductor device after the semiconductor device is sealed into the carrier structure by the carrier layer.

During a semiconductor die transfer from one transfer assembly to another transfer assembly using typical semiconductor flip chip assemblies, rotating transfer heads can block an optical alignment inspection or a quality assurance inspection. Unblocking optical alignments takes time and slows down the machine cycle. The semiconductor device transfer system 200 can reduce or even overcome the blocking of the alignment inspection caused by rotating transfer heads. As shown in FIGS. 2-6, the centers of the rotatable transfer assemblies 204-1, 204-2 are positioned in parallel with the bond surface 216 of the carrier structure 212. Consequently, the alignment assemblies 208-1, 208-2, 208-3 can be placed outside of the device transfer path of a machine cycle, which is the path in which a semiconductor chip 220 rotates from a wafer at the wafer holding device 202 to the carrier structure through the rotatable transfer assemblies. Accordingly, the semiconductor device alignment process performed by the alignment assemblies does not slow down the machine cycle as can be the case with a typical semiconductor device transfer system in which a chip flip unit is placed between a chip transfer unit and a carrier substrate. Therefore, compared to a typical semiconductor device transfer system in which a chip flip unit is placed between a chip transfer unit and a carrier substrate, the semiconductor device transfer system 200 allows the machine cycle to operate at higher frequency and have a higher semiconductor device throughput.

Figure 7:
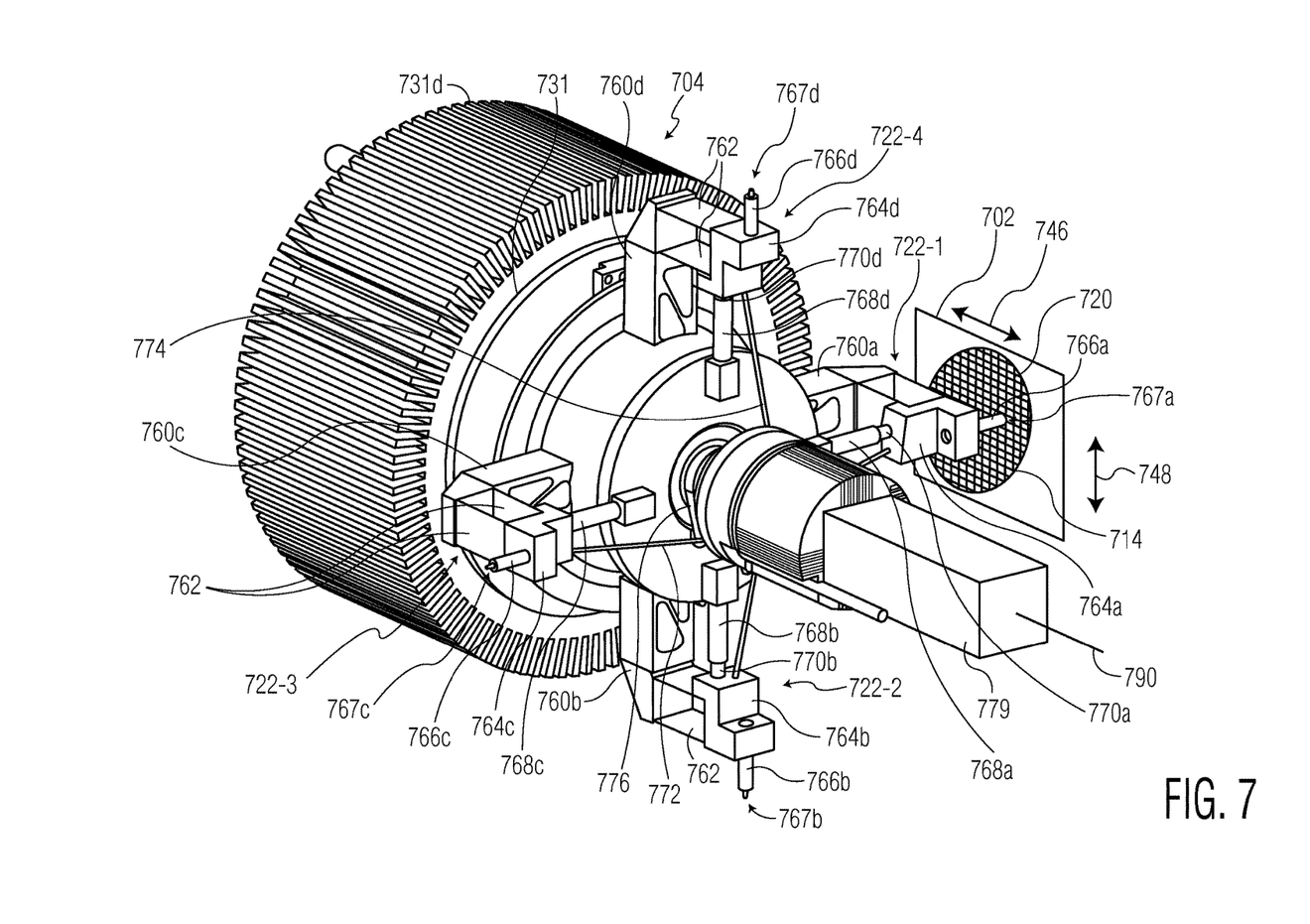
FIG. 7 depicts an embodiment of a rotatable transfer assembly of the semiconductor device transfer system depicted in FIG. 2.

FIG. 7 depicts an embodiment of the rotatable transfer assembly 204-1 depicted in FIG. 2. In the embodiment depicted in FIG. 7, a rotatable transfer assembly 704 includes four transfer heads 722-1, 722-2, 722-3, 722-4. The rotatable transfer assembly is configured to rotate about an axis 790 that is driven by a motor 779 clock-wise or counter clock-wise. A surface of a chip 720 on a wafer 714 is positioned opposite a transfer head 722 in a chip pickup position by moving the wafer in any of the directions shown by arrows 746, 748. In an operation of the rotating assembly, a chip 720 is picked up from the wafer 714 by the transfer head 722-1 and is rotated to a chip-flip position (i.e., the location of the transfer head 722-3) after two index steps. The rotatable transfer assembly 204-2 depicted in FIG. 2 can be implemented the same as or similar to the rotatable transfer assembly 704 depicted in FIG. 7.

In the rotatable transfer assembly 704, each transfer head 722-1, 722-2, 722-3, or 722-4 includes an arm 760a-760d, respectively, a pair of parallel leaf springs 762, blocks 764a-764d, respectively, a collet 766a-766d, respectively, an arm 768a-768d, respectively, and pressure springs 770a-770d, respectively. The transfer heads are connected to a cooling body 731d of a motor 731 that is used to drive the axis 790. Each arm 760a-760d extends essentially radially to the axis 790 from the rotatable transfer assembly. Near the ends of each of the arms 760a-760d, the ends of the pair of parallel leaf springs 762 are fixedly mounted and opposite ends of the pair of leaf springs 762 support the blocks 764a-764d, respectively. In each block 764a-764d, the collet 766a-766d, respectively, is fixedly mounted. The collet 766a-766d is used to pick up and hold a semiconductor device 720 (e.g., an IC chip or die) by suction, by force or by other applicable methods. In some embodiments, the collet has at least one pick-up opening for picking up, holding, and releasing a semiconductor device by varying the pressure at the pick-up opening. When the collet is in a semiconductor device pick-up position, the pick-up opening is brought into close proximity to the semiconductor device, and a low pressure (e.g., vacuum) is generated in the opening, whereby the semiconductor device is sucked to and against the opening. While maintaining the low pressure, the semiconductor device is transferred by the collet to another chip transfer position, and the semiconductor device can be released by applying a higher pressure to the pick-up opening. Each transfer head also includes the arm 768a-768d, respectively, extending essentially radially to the axis 790 from the rotatable transfer assembly. The pressure springs 770a-770d are mounted between the ends of the arms 768a-768d and the respective blocks 764a-764d.

Figure 8:
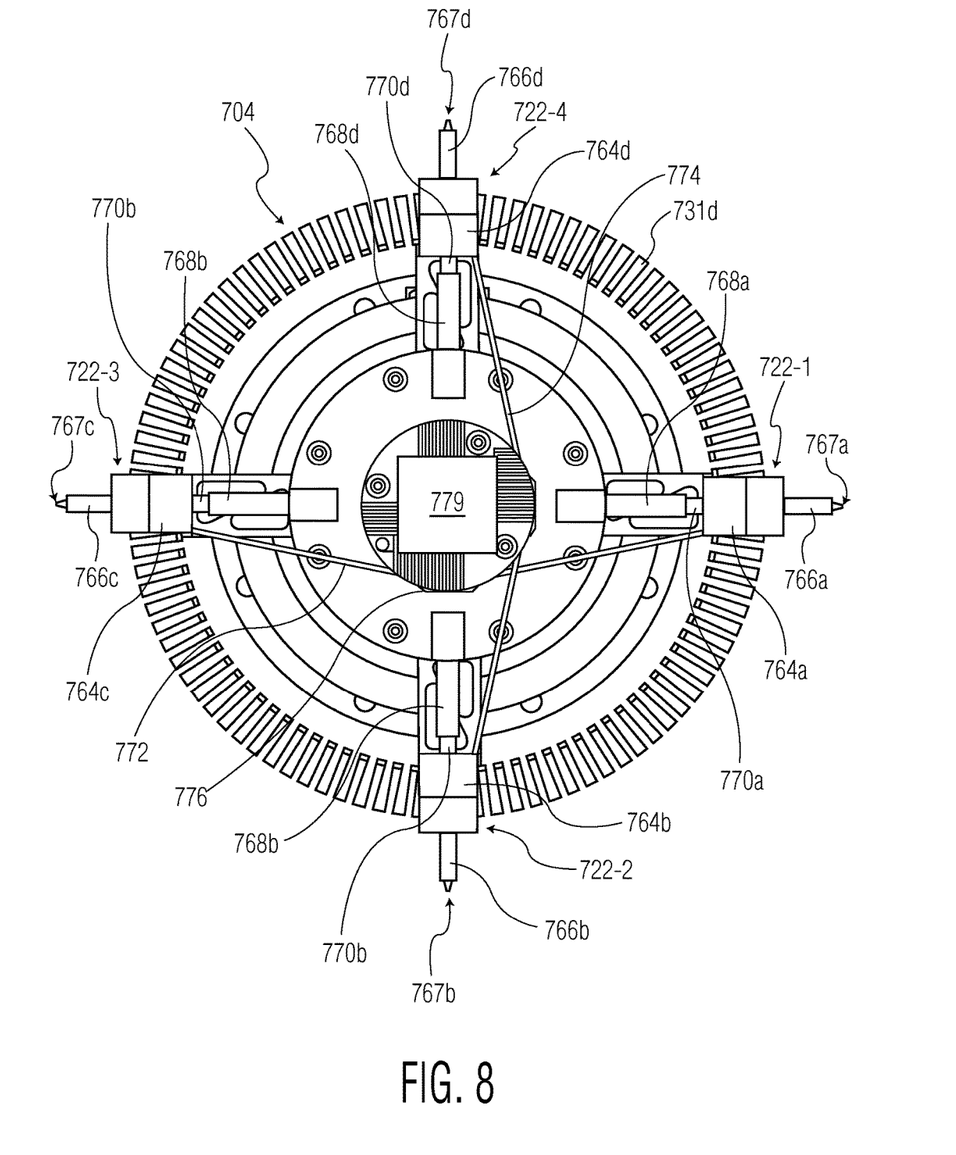
FIG. 8 shows a front view of the rotatable transfer assembly depicted in FIG. 7.

FIG. 8 shows a front view of the rotatable transfer assembly 704 depicted in FIG. 7. As shown in FIG. 8, the block 764a of the transfer head 722-1 is connected to the block 764c of the transfer head 722-3 by a wire 772 and the block 764b of the transfer head 722-2 is connected to the block 764d of the transfer head 722-4 by a wire 774. The wire 772 is fixedly connected, e.g. clamped, to a lever 776, which is connected to a rotatable shaft driven by a motor 779.

Figure 9:
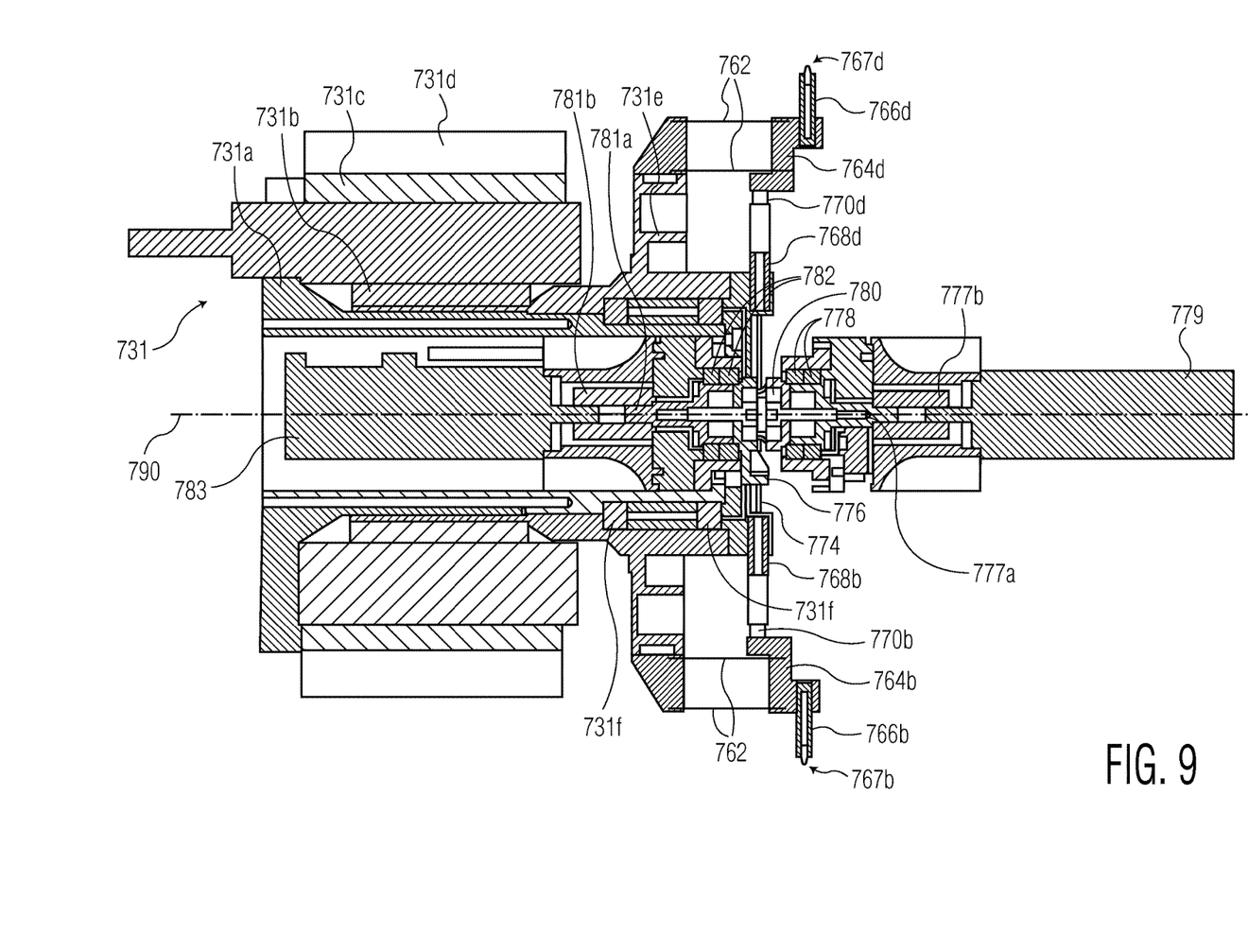
FIG. 9 shows a cross-sectional view of the rotatable transfer assembly depicted in FIG. 7.

FIG. 9 shows a cross-sectional view of the rotatable transfer assembly 704. As shown in FIG. 9, the axis 790 is driven by a motor 731 (FIG. 7) that includes a stator 731a, a magnet ring 731b, a coil block 731c, the cooling body 731d, and a rotor 731e fixedly connected to the magnet ring 731b, and supported by bearings 731f. Coupling parts 777a, 777b are fixedly connected to the rotatable shaft driven by the motor 779. The wire 774 is connected to a lever 780 which in turn is connected to coupling parts 781a, 781b supported by bearings 782. The coupling parts 781a, 781b are connected to a rotatable shaft driven by a motor 783 accommodated in a hollow space inside the motor 731. Both levers 776 and 780 connected to the motors 779 and 783 can be driven independently from each other and independently from the motor 731 about the axis 190.

Figure 10:
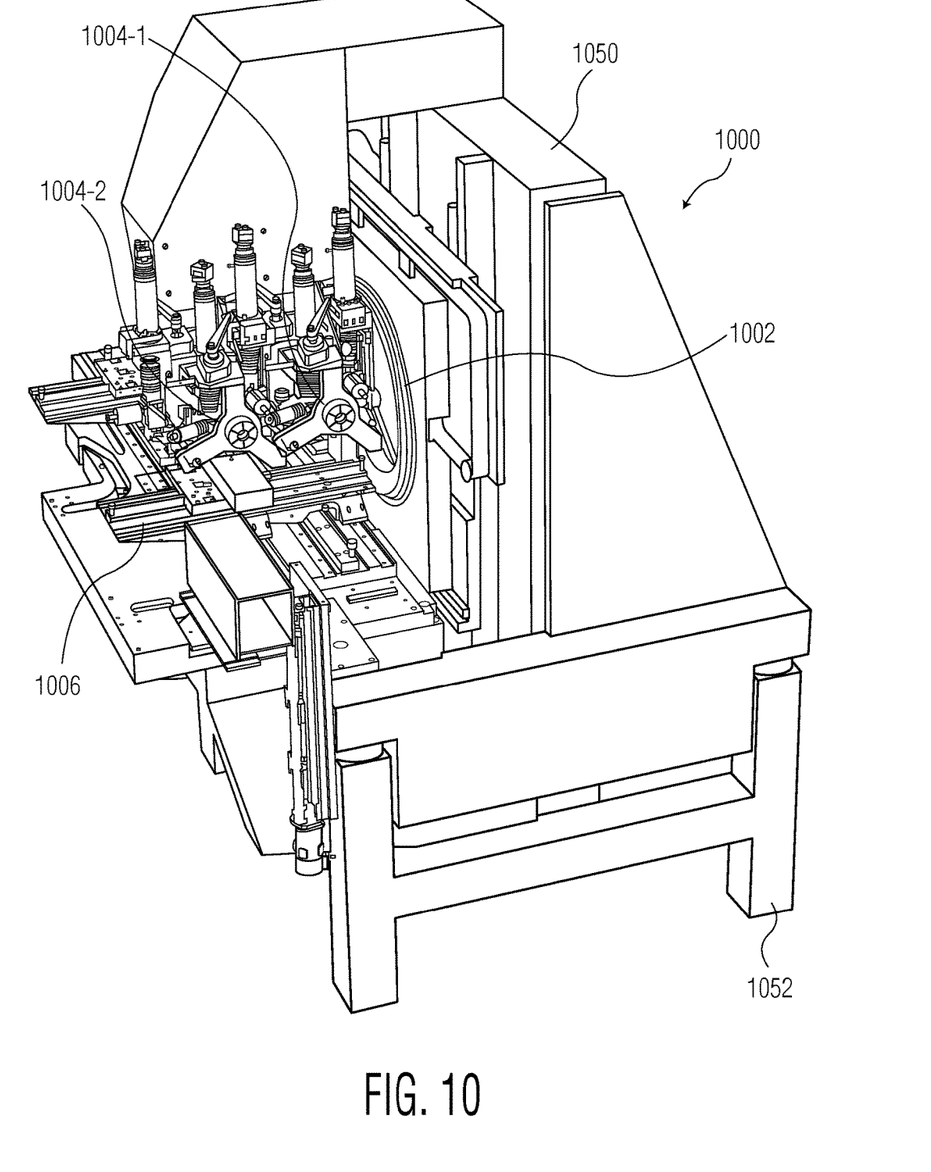
FIG. 10 depicts an embodiment of the semiconductor device transfer system depicted in FIG. 2.

In some embodiments, the semiconductor device transfer system 200 depicted in FIG. 2 is implemented as one machine, such as, a semiconductor device transfer station. FIG. 10 depicts an embodiment of the semiconductor device transfer system depicted in FIG. 2 that is implemented as a semiconductor device transfer station 1000. In the embodiment depicted in FIG. 10, the semiconductor device transfer station includes a base 1052, a body 1050 that includes a wafer holding device 1002, rotatable transfer assemblies 1004-1, 1004-2, and a carrier movement mechanism 1006 used to position a carrier structure. The semiconductor device transfer station also includes alignment assemblies, which are blocked by the rotatable transfer assemblies, and consequently, are not shown in FIG. 10.

Figure 11:
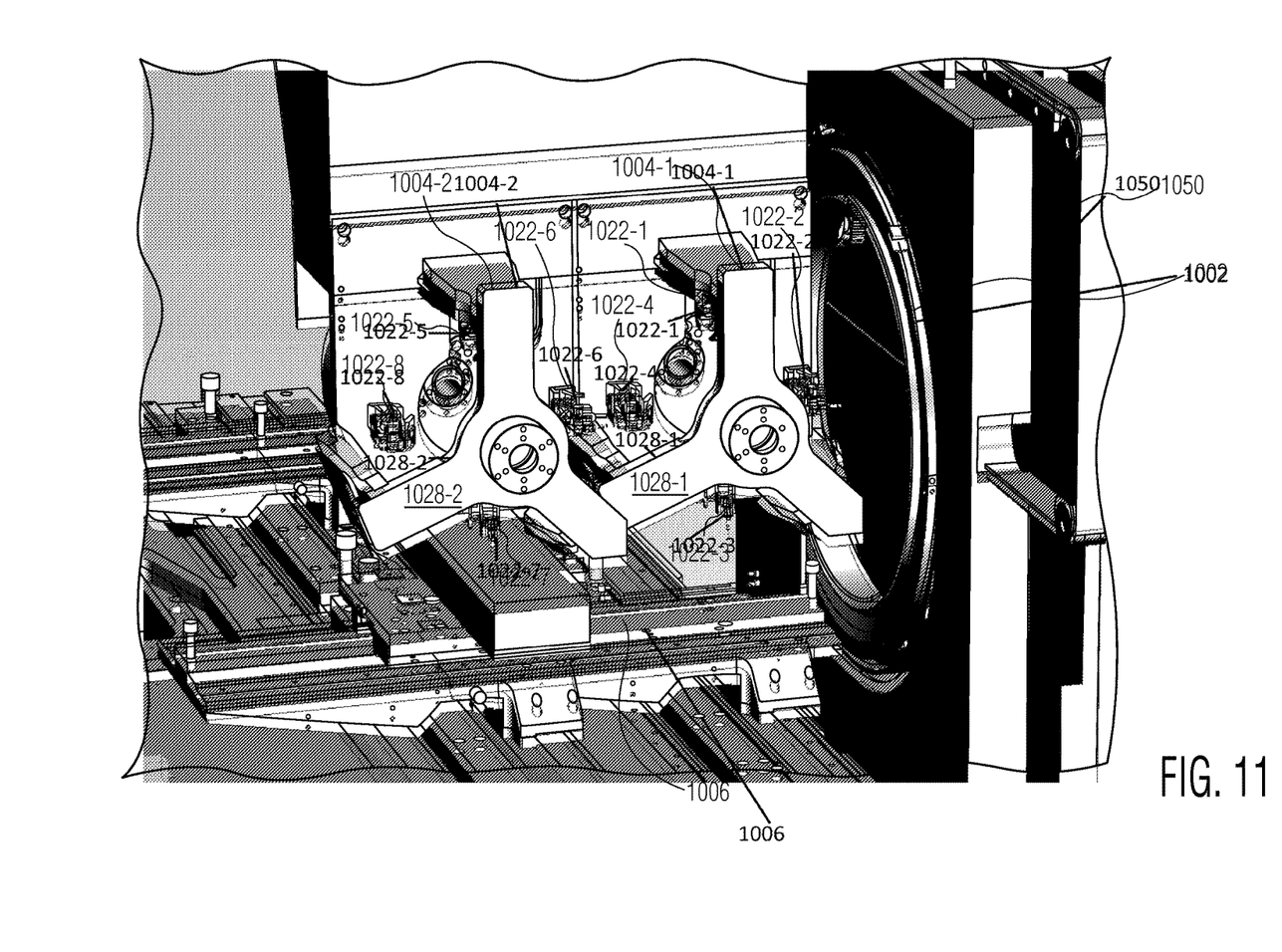
FIG. 11 shows a partial close-up view of the semiconductor device transfer system depicted in FIG. 10.

FIG. 11 shows a partial close-up view of the semiconductor device transfer system 1000 depicted in FIG. 10 that shows the back of the rotatable transfer assemblies 1004-1, 1004-2. As shown in FIG. 11, the rotatable transfer assembly 1004-1 includes four transfer heads 1022-1, 1022-2, 1022-3, 1022-4 and a rotation body 1028-1 and the rotatable transfer assembly 1004-2 includes four transfer heads 1022-5, 1022-6, 1022-7, 1022-8 and a rotation body 1028-2.

Figure 12:
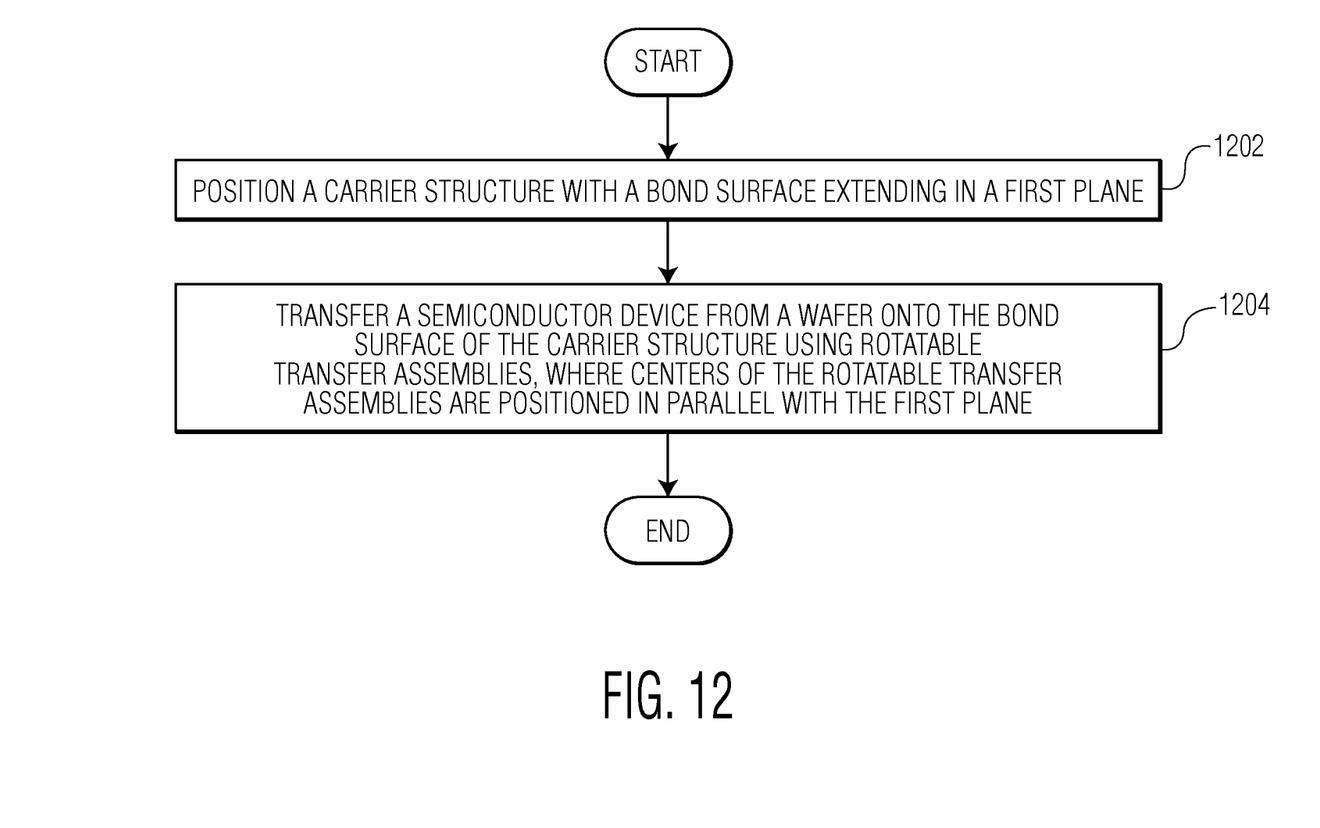
FIG. 12 is a process flow diagram of a method for transferring semiconductor devices from a wafer to a carrier structure in accordance with an embodiment of the invention.

FIG. 12 is a process flow diagram of a method for transferring semiconductor devices from a wafer to a carrier structure in accordance with an embodiment of the invention. At block 1202, a carrier structure with a bond surface extending in a first plane is positioned. At block 1204, a semiconductor device is transferred from a wafer onto the bond surface of the carrier structure using rotatable transfer assemblies, where centers of the rotatable transfer assemblies are positioned in parallel with the first plane. The carrier structure may be similar to or the same as the carrier structure 212 depicted in FIGS. 2-6. The rotatable transfer assemblies may be similar to or the same as the rotatable transfer assemblies 104-1, 104-2 depicted in FIG. 1, the rotatable transfer assemblies 204-1, 204-2 depicted in FIGS. 2-6, the rotatable transfer assembly 704 depicted in FIG. 7, and/or the rotatable transfer assemblies 1004-1, 1004-2 depicted in FIG. 10.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A system for transferring semiconductor devices from a wafer to a carrier structure, the system comprising:
    a carrier movement mechanism configured to position a carrier structure with a bond surface extending in a first plane;
    a wafer holding device configured to hold the wafer and move the wafer perpendicularly to the first plane; and
    a plurality of rotatable transfer assemblies configured to transfer a semiconductor device from the wafer onto the bond surface of the carrier structure, wherein centers of the rotatable transfer assemblies are in a same plane and the same plane is positioned in parallel with the first plane.

2. The system of claim 1, wherein the rotatable transfer assemblies comprise a first rotatable transfer assembly and a second rotatable transfer assembly, wherein each of the first and second rotatable transfer assemblies comprises at least two transfer heads, and wherein the first rotatable transfer assembly is configured to:
    rotate a transfer head of one of the at least two transfer heads to a pick-up position to pick up the semiconductor device from the wafer; and
    rotate the transfer head to a flip position.

3. The system of claim 2, wherein the first rotatable transfer assembly is configured to rotate the transfer head 180 degrees from the pick-up position to the flip position.

4. The system of claim 2, further comprising an alignment device configured to check an alignment of the semiconductor device before the semiconductor device is picked up from the wafer in the pick-up position using the transfer head of the first rotatable transfer assembly.

5. The system of claim 2, wherein the second rotatable transfer assembly is configured to:
    rotate a transfer head to the flip position;
    transfer the semiconductor device from the transfer head of the first rotatable transfer assembly to a transfer head of the two transfer heads of the second rotatable transfer assembly; and
    rotate the transfer head of the second rotatable transfer assembly to place the semiconductor device onto the bond surface.

6. The system of claim 1, further comprising an alignment device configured to check an alignment of the carrier structure before and after the semiconductor device is bonded at a bonding position on the bond surface of the carrier structure.

* * * * *